United States Patent
Neaves et al.

(10) Patent No.: US 12,484,245 B2
(45) Date of Patent: Nov. 25, 2025

(54) POWER DEVICE WITH CURRENT SENSE

(71) Applicant: Cambridge GaN Devices Limited, Cambridge (GB)

(72) Inventors: Philip Neaves, Cambridge (GB); Florin Udrea, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 348 days.

(21) Appl. No.: 18/089,799

(22) Filed: Dec. 28, 2022

(65) Prior Publication Data
US 2024/0222487 A1  Jul. 4, 2024

(51) Int. Cl.
*H10D 30/47* (2025.01)
*G01R 19/00* (2006.01)
(Continued)

(52) U.S. Cl.
CPC ....... *H10D 30/475* (2025.01); *H01L 21/0254* (2013.01); *H10D 30/015* (2025.01); *H10D 62/824* (2025.01); *H10D 62/8503* (2025.01)

(58) Field of Classification Search
None
See application file for complete search history.

(56) References Cited

U.S. PATENT DOCUMENTS 6,304,108 B1  10/2001  Inn
6,433,386 B1   8/2002  Yun et al.
(Continued)

FOREIGN PATENT DOCUMENTS

CN  108370248 A  8/2018
CN  114142820 A  3/2022
(Continued)

OTHER PUBLICATIONS

TW Office Action for TW application No. 112151360, dated Nov. 22, 2024, 10 pages.
(Continued)

*Primary Examiner* — Grant S Withers
(74) *Attorney, Agent, or Firm* — Tarolli, Sundheim, Covell & Tummino LLP (57) ABSTRACT

According to a first aspect of the disclosure, there is provided an electronic device comprising: a power device circuit comprising: (i) a main power transistor, comprising a main drain terminal, a main source terminal and a main gate terminal, (ii) a resistive sensing load, and (iii) a sensing transistor comprising a source connected to the main source terminal, a gate connected to the main gate terminal and a drain connected to a first terminal of the resistive sensing load. The electronic device further comprises: a feedback circuit comprising at least one operational amplifier and at least one transconductor, and a switching circuit comprising at least one switch for connecting and disconnecting the power device circuit to the feedback circuit. A first input of the at least one operational amplifier and a second terminal of the resistive sensing load are selectively connected to the main drain terminal through the switching circuit. A second input of the at least one operational amplifier and at least one output of the at least one transconductor are selectively connected to the drain of the sensing transistor through the switching circuit. The main power transistor has a first area or gate perimeter and the sensing transistor has a second area or gate perimeter smaller than the first area or gate perimeter. During an ON state of the main power transistor, the output current of the transconductor of the feedback circuit is proportional to the potential difference between the main drain terminal and the drain of the sensing transistor, result- (Continued)

ing in a voltage across the resistive sensing load of substantially zero.

20 Claims, 10 Drawing Sheets

(51) Int. Cl.
*H01L 21/02* (2006.01)
*H10D 30/01* (2025.01)
*H10D 62/824* (2025.01)
*H10D 62/85* (2025.01)

(56) References Cited

U.S. PATENT DOCUMENTS

| | | |
|---|---|---|
| 10,818,786 B1 | 10/2020 | Udrea |
| 11,081,578 B2 | 8/2021 | Udrea et al. |
| 11,217,687 B2 | 1/2022 | Udrea |
| 11,404,565 B2 | 8/2022 | Udrea |
| 2002/0005738 A1 | 1/2002 | Inn |
| 2005/0231177 A1 | 10/2005 | Tateno et al. |
| 2009/0039869 A1 | 2/2009 | Williams |
| 2014/0347078 A1 | 11/2014 | Qin |
| 2019/0238124 A1 | 8/2019 | Tajima |
| 2020/0395905 A1 | 12/2020 | Schober |
| 2022/0208761 A1 | 6/2022 | Udrea |
| 2024/0162224 A1 | 5/2024 | Udrea et al. |

FOREIGN PATENT DOCUMENTS

| | | |
|---|---|---|
| JP | 2009075957 A | 4/2009 |
| JP | 2010224825 A | 10/2010 |
| JP | 2011109196 A | 6/2011 |
| JP | 2012124565 A | 6/2012 |
| WO | 2017097497 A1 | 6/2017 |

OTHER PUBLICATIONS

German Office Action for German application No. 10 2023 134 219.3, dated Aug. 28, 2024, 13 pages.
LU Search Report and Written Opinion for corresponding LU Application No. 503269, dated Jun. 21, 2023, pp. 1-5.
Cheung Fai Lee et al: "On-chip current sensing technique for CMOS monolithic switch-mode power converters", 2002 IEEE International Symposium on Circuits and Systems. Proceedings (Cat. No. 02CH3735), vol. 5, Jan. 1, 2002, pp. V-265; XP055065041, DOI: 10.1109/ISCAS.2002.1010691, ISBN: 978-0-78-037448-5, figure 2.
Yuang-Shung Lee et al: "High Accuracy CMOS Current Sensing Circuit for Current Mode Control Buck Converter", Power Electronics and Drive Systems, 2007. PEDS '07. 7th International Conference on, IEEE, Piscataway, NJ, USA, Nov. 27, 2007, pp. 44-48, XP031242485, ISBN: 978-1-4244-0644-9, figure 2.
GB Search Report for GB application No. GB2320093.4. dated Jun. 20, 2024, 4 pages.
Japanese Office Action for JP application No. 2023-217823, dated Jan. 21, 2025, 2 pages.

POWER DEVICE WITH CURRENT SENSE

FIELD OF THE DISCLOSURE

The disclosure relates to power semiconductor devices and current sensing in power semiconductor devices. Particularly, but not exclusively, the disclosure relates to the use of a hetero-structure AlGaN/GaN high electron mobility transistor.

BACKGROUND OF THE DISCLOSURE

Gallium Nitride (GaN) is a wide band gap material suitable for power and RF semiconductor devices.

GaN technology allows transistors with high electron mobility and high saturation velocity, both of which are of high importance in the field of power and RF electronics. The GaN material has extra advantages in power devices. The wide band gap of the material ($E_g$=3.39 eV) results in high critical electric field ($E_c$=3.3MV/cm) which can lead to the design of devices with a shorter drift region, and therefore lower on-state resistance, if compared to a silicon-based device with the same breakdown voltage.

The use of an Aluminium Galium Nitride (AlGaN)/GaN heterostructure also allows the formation of a two-dimensional electron gas (2DEG) at the hetero-interface where carriers can reach very high mobility ($\mu$=2000 cm$^2$/(Vs)) values. In addition, the piezopolarization charge present at the AlGaN/GaN heterostructure, results in a high electron density in the 2DEG layer (e.g. 1e$^{13}$ cm$^{-2}$). These properties allow the development of High Electron Mobility Transistors (HEMTs) and Schottky barrier diodes with very competitive performance parameters. An extensive amount of research has focused on the development of power devices using AlGaN/GaN heterostructures. There are several technologies that enable normally on (Schottky gate based technology) and normally off (insulated gate and p-GaN gate technology) HEMT devices.

In power electronics there is often a need for protection and sensing circuitry (e.g. current sensing, over-voltage protection, temperature sensing) to be integrated with the main, often enhancement mode, power switch. Out of these, current sensing is one of the critical circuits to be implemented with the power device.

In some current sensing devices, a sensing resistor is provided to assist in the detection and/or measurement of a current. The current sensing signal ($V_{cs}$) across the sensing resistor is generally proportional to the current through the sensing resistor. Ideally, the current through the sensing resistor is a constant fraction of the current through the main power device across the entire intended current range, and across the entire desired operational temperature range (e.g. −55 C to 150 C).

However, there exists a trade-off in existing current sensing devices between the sensitivity of the device on one hand, and the linearity of the current sensing/accuracy with varying conditions on the other. This is because a high $V_{cs}$ signal increases the sensitivity of the device, while a low $V_{cs}$ signal improves the linearity of the current sensing signal and the accuracy of the current sensing signal with respect to temperature and manufacturing-process variations. From a linearity and accuracy perspective, the signal $V_{cs}$ is ideally close to zero volts, such that the current through a sensing HEMT is a constant fraction of the current through the main power device across the whole range of currents.

The signal $V_{cs}$ may be influenced by temperature for several reasons. For example, the resistance of any several components used in the current sensing device, such as transistors and resistors, may vary with temperature. Additionally, the precise current sharing ratio between e.g. a main HEMT transistor and a current sensing HEMT transistor may also vary with temperature.

Moreover, unlike Silicon-based or other semiconductor-based power devices, GaN HEMTs suffer from a condition known as dynamic on-state resistance (Ron). This condition can be described as a variation in the on-state resistance when a prior high voltage stress is applied to the main device. The dynamic on-state resistance is important in the context of device power losses during long-term operation, but it can also play a second order effect in current sensing operations. For example, when a high voltage stress is applied, only the main HEMT and the current sensing transistor of a GaN device are affected by the dynamic Ron, while the sensing load resistance $R_{CS}$ is virtually unaffected. This further deteriorates the linearity of the current sensing across the current range, and the accuracy of the current sensing with respect to temperature.

As such, the Applicant has therefore recognised a need for a current sensing device with an improved trade-off between sensitivity and measurement accuracy across a range of conditions.

U.S. Pat. No. 6,433,386 (B1) describes a sense field-effect transistor (FET) that is capable of achieving many available sense current ratios after manufacture, and a method of manufacturing the same. The sense FET includes a main cell array of metal-oxide-semiconductor field-effect transistor (MOSFET) cells connected in parallel, and a main pad connected to the sources of the main cells.

U.S. Ser. No. 10/818,786 (B1) describes a III-nitride semiconductor based heterojunction power device, comprising a first heterojunction transistor formed on a substrate and a second heterojunction transistor formed on a substrate, wherein the second heterojunction transistor is used in sensing and protection functions of the first power heterojunction transistor.

US2022/0208761 (A1) describes an III-nitride semiconductor based heterojunction power device, comprising: a first heterojunction transistor formed on a substrate and a second heterojunction transistor formed on a substrate, wherein the second heterojunction transistor is used in sensing and protection functions of the first power heterojunction transistor. The device also includes a monolithically integrated current sensing transistor that has a substantially identical structure to the first heterojunction transistor, and wherein the current sensing transistor is scaled to a smaller area or a shorter gate width when compared to the first heterojunction transistor.

U.S. Ser. No. 11/081,578 (B1) describes a depletion mode III-nitride semiconductor based heterojunction device, comprising a substrate; a III-nitride semiconductor region formed over the substrate, and at least two highly doped semiconductor regions spaced apart from each other.

U.S. Ser. No. 11/217,687 (B1) and U.S. Ser. No. 11/404,565 (B1) describe an integrated auxiliary gate terminal and a pulldown network to achieve a normally-off (E-Mode) GaN transistor with threshold voltage higher than 2V, low gate leakage current and enhanced switching performance.

U.S. Pat. No. 6,304,108B1 describes a reference-corrected ratiometric current sensing circuit for sensing a current flowing through a load and a power-controlling pass device includes a sense device, a sense resistor, and a variable reference current source for providing a varying reference current.

SUMMARY

The present disclosure generally relates to semiconductor structures and devices formed in wide-bandgap semiconductors, and more specifically to Group III nitrides, such as GaN and $Al_xGaN_{1-x}$ structures, and heterostructures using two-dimensional electron gas layers (2DEG). Heterojunction power devices are high voltage HEMTs.

According to a first aspect of the disclosure, there is provided an electronic device comprising: a power device circuit comprising: (i) a main power transistor, comprising a main drain terminal, a main source terminal and a main gate terminal, (ii) a resistive sensing load, and (iii) a sensing transistor comprising a source connected to the main source terminal, a gate connected to the main gate terminal and a drain connected to a first terminal of the resistive sensing load. The electronic device further comprises: a feedback circuit comprising at least one operational amplifier and at least one transconductor, and a switching circuit comprising at least one switch for connecting and disconnecting the power device circuit to the feedback circuit. A first input of the at least one operational amplifier and a second terminal of the resistive sensing load are selectively connected to the main drain terminal through the switching circuit. A second input of the at least one operational amplifier and at least one output of the at least one transconductor are selectively connected to the drain of the sensing transistor through the switching circuit. The main power transistor has a first area or gate perimeter and the sensing transistor has a second area or gate perimeter smaller than the first area or gate perimeter. During an ON state of the main power transistor, the output current of the transconductor of the feedback circuit is proportional to the potential difference between the main drain terminal and the drain of the sensing transistor, resulting in a voltage across the resistive sensing load of substantially zero.

Optionally, during an OFF state of the main power transistor, the switching circuit is configured to disconnect the feedback circuit from the power device circuit, resulting in an increase of a drain to source voltage of the sensing transistor until said voltage is substantially the same as a drain to source voltage of the main power transistor Optionally, an output current of the feedback circuit is directly proportional to a current flowing through the main power transistor.

Optionally, the operational amplifier is configured to amplify a potential difference between the main drain terminal and the drain of the sensing transistor, wherein an output of the operational amplifier is connected to an input of the transconductor, and wherein an output current of the transconductor is proportional to the output of the operational amplifier.

Optionally, the feedback circuit is configured to provide the output current of the transconductor to the drain terminal of the sensing transistor to create a feedback loop configured to maintain the potential difference between the main drain terminal and the drain of the sensing transistor at a constant value.

Optionally, the operational amplifier is configured to be operated in a low power consumption mode by a conditioned gate drive signal wherein the gate drive signal is inverted, time shifted, or level shifted.

Optionally, the at least one transconductor is a p-channel transistor.

Optionally, the switching circuit is configured to: (i) connect the feedback circuit to the power device circuit a predetermined time after turn-on of the power device circuit and (ii) disconnect the feedback circuit from the power device circuit a predetermined time before turn-off of the power device circuit.

Optionally, the switching circuit comprises a first, a second and a third switch configured to connect and disconnect: the main drain terminal to the first input of the operational amplifier of the feedback circuit, the drain of the sensing transistor to the second input of the operational amplifier, and an output of the transconductor to the drain of the sensing transistor, respectively.

Optionally, the first, second and third switches comprise enhancement mode HEMTs.

Optionally, the first, second and third switches comprise T-type switches with two enhancement mode transistors connected in series, the respective gate terminals of the first, second and third switches being connected to a switch enable signal and a high impedance component having a first end connected between the respective two enhancement mode transistors and a second end connected to ground.

Optionally, the feedback circuit comprises a current mirror circuit configured to generate an output current identical to the output current of the transductor.

Optionally, the electronic device is configured to convert the output current of the current mirror circuit into an output voltage signal using a resistor.

Optionally, the electronic device comprises a digitally programmable decoder configured to adjust a gain of the current mirror circuit responsive to one or more digital inputs to the digitally programmable decoder.

Optionally, the electronic device comprises a wide-bandgap semiconductor die and a silicon semiconductor die, wherein the power device circuit and the switching circuit are provided on the wide-bandgap semiconductor die and the feedback circuit is provided on a silicon semiconductor die.

Optionally, the wide-bandgap semiconductor die and the silicon semiconductor die are incorporated in a single system-in-package.

Optionally, the silicon semiconductor die comprises at least one of: a gate driving circuit; an over-current protection circuit; an over-temperature detection and protection circuit; an under-voltage detection or lock out circuit; a voltage regulator; a bandgap reference circuit; a level shifter; an ESD protection circuit; a start-up circuit; a logic circuit; memory storage; and/or a slew rate control circuit.

Optionally, the wide-bandgap semiconductor die is a gallium nitride (GaN) die.

Optionally, the electronic device comprises a wide-bandgap semiconductor die and a silicon semiconductor die, wherein the power device circuit is provided on the wide-bandgap semiconductor die, and the switching circuit and the feedback circuit are provided on a silicon semiconductor die.

Optionally, the main power transistor comprises an active heterojunction transistor comprising a, Miller clamp transistor, and wherein the Miller clamp transistor is monolithically integrated with driving circuitry of the active heterojunction transistor.

In general terms, the electronic device of the present disclosure uses a feedback circuit to ensure that the sensing transistor is always driven at the same voltage level as the main power transistor. This ensures that any inferences about the current flowing through the main power transistor made using the sensing transistor are more accurate because the sensing transistor (with which such inferences are made) is subject to substantially the same operational conditions (such as voltage, temperature and so on) as the main power transistor by virtue of the output of the feedback circuit.

More generally, the sensing transistor has a similar architecture to the main power transistor which means that the sensing transistor and main power transistor have substantially identical structures (i.e. they comprise the same materials and layers as each other) and operation. However, the sensing transistor, which is used to make inferences about current flowing through the main power transistor is scaled to a different area or gate perimeter than the main power transistor by a given scale factor X. The scale factor X is envisaged to be larger than 1 which means that the sensing transistor is smaller than the main power transistor by that factor. For example, a scale factor of 2 would mean that the area or gate perimeter of the main hetero junction is twice the size of the sensing transistor. Conversely, a scale factor less than 1 would mean that the sensing transistor is larger than the main power transistor.

A sensitivity S of a current sensing device may be defined as the ratio between the output (voltage) signal $V_{cs}$ and the current through the main power device $I_{main}$, such that:

$$S = \frac{V_{CS}}{I_{main}} \quad (1)$$

For a current sensing device, an "ideal" linearity means that sensitivity of the current sensing is linear across the entire current range, i.e. that the derivative of the sensitivity with respect to current $(dS/dI_{main})$ is or is close to being a constant value across the whole current range of the device. The linearity of the signal may therefore be defined as a measure of how close this derivative is to being a constant value across the current range.

With an ideal linearity, the signal $V_{cs}$ is an accurate measure of the current through the main power device 19 (illustrated in FIG. 2) across the entire current range, as $V_{cs}$ is linearly increasing with the current through the main power device 19. In reality, the signal $V_{cs}$ is not perfectly linear for many reasons, several of which are discussed below. However, the closer the linearity is to being a constant value, the better the accuracy of the current sensing solution with respect to current.

One factor that can affect the linearity of the current sensing signal $V_{cs}$ is temperature. The accuracy of the signal $V_{cs}$ with respect to temperature may be defined as how close the derivative of the sensitivity with respect to temperature (dS/dT) is to being zero, i.e. such that an "ideal" accuracy with respect to temperature means that this derivative is zero across the whole temperature range and there is no variation in the linearity of the signal $V_{cs}$ with respect to temperature (at least across an expected or desired operating range of temperatures).

A further factor that can affect the linearity of the current sensing signal $V_{cs}$ is (manufacturing) process variation. In this context, process variation refers to a generic parameter that describes variability in the structure of the current sensing device, such as differences between metal layers, 2DEG charges, doping profiles, trap distribution within different semiconductor layers or at interfaces and gate leakage between devices on the same chip, on the same wafer or from wafer to wafer or from batch to batch. The accuracy of the signal $V_{cs}$ with respect to process variation may be defined as how close the derivative of the sensitivity with respect to process variation (dS/dPV) is to being zero, i.e. such that an "ideal" accuracy with respect to process variation means that this derivative is zero across the whole range of statistical process variation and there is no variation in the linearity of the signal $V_{cs}$ with respect to process variations.

Therefore, a more temperature independent method of current sensing is needed which also has a better dynamic Rdson tolerance. One can conclude that ideally the voltage signal across the sensing load should be very small when compared to voltage drop between the source and drain terminals (or the sensing load resistance should be small when compared to the resistance of the sense HEMT transistor) to improve accuracy of the current sensing solution.

In general terms, it is the object of the present disclosure to provide a current sensing circuit that is able to maintain high linearity, accuracy and high sensitivity across the desirable current and temperature range and offer high immunity against changes in dynamic Ron. The present disclosure provides a solution by using a feedback circuit, as will be described below.

As outlined, maintaining a largely identical drain-to-source bias for the main power transistor and the sensing transistor during both on-state operation and off-state operation can help in improving the performance of the current sensing circuit.

Thus, as described above, in one example, the feedback circuit is configured to maintain the drain potential of the sensing transistor to largely the same potential as the drain potential of the main power transistor. As described in above, the drain terminal of the main power transistor may be connected as a first input to the feedback circuit, and the drain terminal of the sensing transistor may be connected as a second input to the feedback circuit. In one example, the feedback circuit may comprise an operational amplifier (op-amp) which receives the voltage signal inputs of the feedback circuit. In operation, the op-amp may be configured such that an increase in the voltage input (i.e. a difference in the potential of the main transistor drain potential and the sensing transistor drain potential) of the op-amp leads to an increase in the output of the op-amp. The output of the op-amp may be connected to a transconductor which may comprise at least one transistor as an example. Hence, the output of the op-amp would be connected to the gate of the at least one transistor of the transconductor which controls the output of the feedback circuit. The output of the feedback circuit may be (indirectly) connected to the sensing terminal of the sensing transistor, as described in the first aspect of this invention, creating a feedback loop which is configured to maintain the drain potential of the main power transistor and the sensing transistor at largely the same potential. This is possible if the output current of the feedback circuit settles at equilibrium output current of IDS/X, where IDS is the drain-to-source current through the main power transistor in on-state operation and X is the scale factor as defined herein.

The feedback circuit output current IDS/X may be mirrored and provided as a current sense output signal of the power device. The current signal may be converted to a voltage signal through the use of a resistor. In some examples, the current mirror gain may be adjustable using a digital decoder.

It may be desirable that in the off-state mode of operation the drain terminal of the main power transistor and sensing transistor are disconnected as inputs of the feedback circuit. Similarly, the output of the feedback circuit may be disconnected from the drain terminal of the sensing transistor. This may be necessary to protect the op-amp as the drain terminal of the main power transistor and sensing transistor can reach a high voltage (e.g. >50V) in the off-state mode of operation. This is the function of the switching circuit described in the first aspect of this invention. The switches described need to conduct during the on-state mode of operation of the power transistor and block during the off-state mode of operation of the power transistor. The signal controlling the switch may therefore be largely similar to the signal driving the power transistor. Nonetheless, as it is important that the feedback circuit is always disconnected when a high voltage is present at the drain of the power transistor, the edges of the signal controlling the switch may be shifted in time compared to the edges of the signal controlling the power transistor. In other examples, the signal controlling the switch may be level shifted compared to the power transistor gate driving signal.

In the off-state mode of operation and with the feedback circuit disconnected from the drain of the power and sensing transistors, the sensing load ensures that the drain of the power transistor and the drain of the sensing transistor are at largely the same potential. The off-state leakage is low in this condition and therefore the voltage drop across the sensing load is negligible. By maintaining a largely identical drain-to-source voltage across the main transistor and the sensing transistor during the off-state, the Dynamic Rdson increase experienced by the main transistor and sensing transistor should be largely the same.

In some examples, the power dissipation of a operational amplifier or the feedback circuit may be dependent on the gate signal of the main power transistor. A conditioned version of the gate signal (e.g. inverted, time shifted, level shifted) may be used to enable or disable a low power consumption mode for the operational amplifier or feedback circuit.

The design considerations described are intended to improve the linearity of the current sensing signal and the accuracy of the current sensing signal with respect to temperature and manufacturing-process variations, while also making the sensing immune against changes in dynamic Ron.

The power device circuit in the above aspect of this disclosure may be designed on a wide bandgap semiconductor material. One example material could be Gallium Nitride (GaN) and in particular devices based on AlGaN/GaN heterojunction structures. Other examples of wide-bandgap semiconductor material include but not limited to silicon carbide, gallium arsenide, indium phosphide or diamond. Other circuits described in the first aspect of this invention may also be designed on a wide bandgap material or may be designed on a different material such that the overall circuit is implemented on two chips comprised of different semiconductor material.

The electronic device described in the above aspect of this disclosure may be implemented on two different semiconductor materials which may however be present on the same chip. One example may be in a GaN-on-Si technology, where part of the circuit is implemented on GaN (for example the high voltage components) and part of the circuit is implemented in Silicon.

In some examples, the feedback circuit may be implemented in a co-packaged Silicon chip rather than be implemented monolithically on the same GaN chip as the main and sensing transistors. Implementing the feedback circuit in Silicon may have several advantages, such as reduced power consumption, improved speed etc. due to the availability of mature p-channel devices in Silicon which are at a significantly earlier stage of development in GaN technology.

The Silicon chip may be included in the same package as the GaN chip i.e. they are co-packaged. Including a Silicon chip in the package allows additional functionality to be implemented in a more mature technology. Examples of blocks which may be designed on Silicon to complement the operation of the power transistor in GaN are gate drive, bandgap reference, over-current protection (OCP), temperature sensing and over-temperature protection (OTP), voltage regulators, slew rate control, UVLO, level shifter, ESD protection, logic circuits, start-up circuits etc.

There may still be an advantage to keep certain additional components/circuits/circuit blocks in GaN. For example high voltage transistors in addition to the main power transistor, components/circuits where the parasitics in the connection to the main power transistor are of significance (e.g. Miller clamp) and/or components where matching in process/temperature matters.

In some examples, the switches connecting/disconnecting the feedback circuit may be designed on GaN and in other examples they may be designed in Silicon. Designing these switches in GaN may be preferable as they are required to block high voltage and can therefore be of a similar technology to the power transistor.

BRIEF DESCRIPTION OF THE DRAWINGS

The present disclosure will be understood more fully from the accompanying drawings, which however, should not be taken to limit the disclosure to the specific embodiments shown, but are provided for aiding in explanation and understanding only.

DETAILED DESCRIPTION OF THE DRAWINGS

Figure 1:
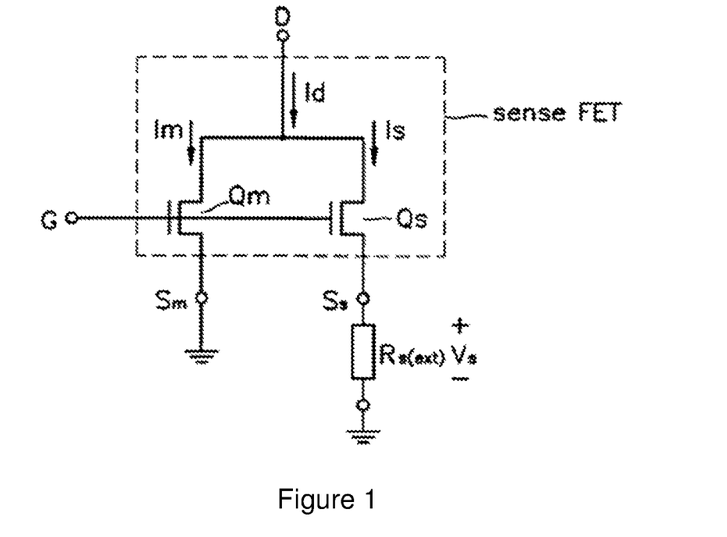
FIG. 1 depicts schematically an example sense Field Effect Transistor (FET).

FIG. 1 shows an example sense FET. The sense FET includes a main FET $Q_m$ and a Sub FET $Q_s$. The main FET and the sub FET are connected in parallel, but two sources are provided. Main Source $S_m$ of the main FET is grounded, while sense source $S_s$ of the sub FET is connected to an external sense resistor $R_{s(ext)}$, to detect a voltage drop Vs of the sense resistor. An external connection for the $R_{s(ext)}$ is provided via a pin. The main and sub FETs are made from a number of identically structured cells, and therefore possess identical current-voltage characteristics. However, the main FET may be provided with many (e.g. hundreds or thousands) times the number of cells compared to the sub FET. As a result, the sub FET carries a current $I_s$ that is a predetermined percentage of the current $I_m$ carried by the main FET, since an on-resistance value of the MOSFET is inversely proportional to the number of cells in the FET, which means that the on-resistance value of the sub FET is much higher than that of main FET.

Figure 2:
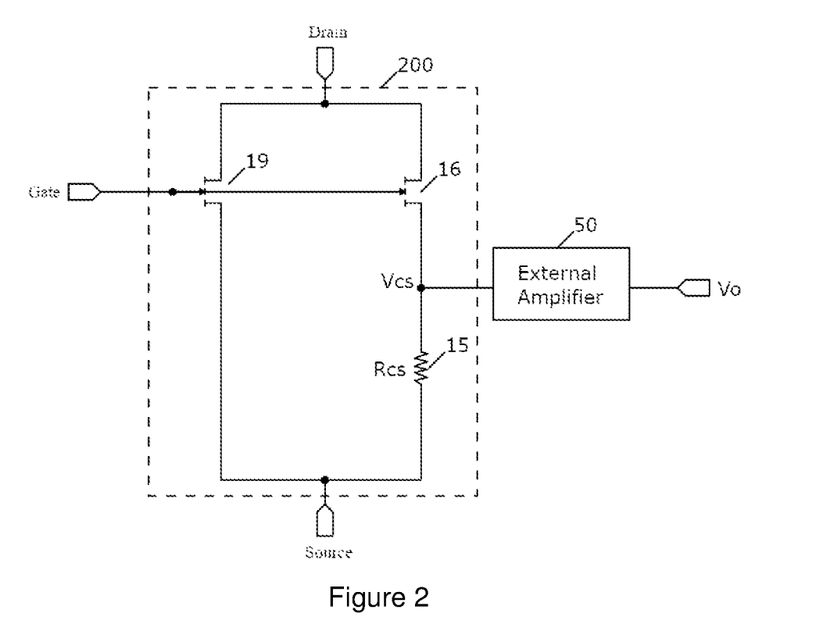
FIG. 2 depicts schematically an example current sensing circuit with an external amplifier.

FIG. 2 shows an example of a monolithically integrated GaN chip 200 comprising a main power device or first power transistor 19 and a current sensing transistor 16. In this example, the current sensing transistor 16 is identical in structure to the main power device 19, but scaled down in terms of surface area or number of fingers when compared to the main power device by a known ratio, e.g. such that the current sensing transistor 16 is 100x smaller or 1000x smaller than the main power device 19. The main power device 16 is a main high voltage HEMT and the current sensing transistor is a high voltage sense HEMT. The source of the current sensing transistor 16 is connected to a load or a current sensing resistor 15. The resistor 15 may also be monolithically integrated with the main power device 19 and the current sensing transistor 16, or could be provided externally. In this arrangement, the sensing signal $V_{cs}$ is proportional to the current through the sensing resistor 15. Under ideal conditions, the current through the sensing resistor 15 is a constant fraction of the current through the main power device 19 across the whole current range and across the entire desirable temperature range (e.g. −55 C to 150 C).

In GaN chip 200, $V_{cs}$ may be adjusted by increasing or decreasing the resistance $R_{cs}$ of the sensing resistor 15. During the linear on-state operation, the main HEMT device 19 and the HEMT sense transistor 16 can be modelled as resistors controlled by the gate voltage potential (with resistances $R_{on-main}$ and $R_{on-sense}$, respectively). For a low $V_{cs}$ (which generally provides improved linearity of the current sensing solution), the ratio between $R_{cs}$ and $R_{on-sense}$ is ideally small (e.g. less than 0.1). This is because, under this model:

$$V_{CS} = \frac{R_{CS}}{R_{CS} + R_{on-sense}} V_{ds} \quad (2)$$

where $V_{cs}$ is the voltage drop across the drain-source terminals of the current sense transistor 16. As a result, $R_{cs}$ being small when compared to $R_{on-sense}$ helps to alleviate the effect of the dynamic $R_{on}$ of the current sense transistor 16 and improve the current sensing accuracy of the device.

One solution to the trade-off between the sensitivity and linearity of the signal $V_{cs}$ is to keep $V_{cs}$ relatively low to improve linearity and accuracy of current sensing (e.g. with respect to temperature and process variations, and providing an external amplifier 50 connected to the $V_{cs}$ node to increase the sensitivity of the current sensing device, as shown in FIG. 2. In this case, the sensitivity of the current sensing is given by the ratio between the output signal $V_o$ (which is equal to the product of $V_{cs}$ and the amplification of the amplifier 50) and the current $I_{main}$ through the main power device 19. However, providing an external amplifier 50 results in a higher bill of material (BOM), and therefore increases production costs. Moreover, parasitic components (e.g. parasitic inductances, capacitances and resistances) resulting from the extra connections between the GaN chip 200 and the external chip of the amplifier 50 may affect the current sensing reading, especially at high operating frequencies. Any attempt to monolithically integrate the amplifier 50 with the power switching device 19 in GaN chip 200 is significantly complicated by the fact that the potential on the current sensing node $V_{cs}$ is very low (in most cases lower than the threshold voltage of an enhancement mode transistor), and the sensing load 15 is attached to ground level.

On the other hand, as mentioned above, it is often advantageous to restrict the maximum voltage across a sensing load. If this sensing voltage is too high (e.g. greater than 0.3 V), the current through the current sensing transistor may no longer scale with the current in the main transistor, compromising the linearity of the sense signal $V_{cs}$. Furthermore, and as already mentioned, the linearity and accuracy can be further compromised across the temperature range and in the presence of other factors such as Dynamic on-state resistances (specific to GaN HEMTs) and manufacturing tolerances. From the discussions above, it will therefore be understood that it is sometimes advantageous to limit the maximum voltage drop across the sensing load to be as small as possible, e.g. smaller than 0.3V, smaller than 0.2V or even smaller than 0.1V. If the sensing load and the sensing transistor are provided in series (as in FIG. 1 and FIG. 2), the sum of the voltages across the sensing load and the sensing transistor (i.e. between the drain and source terminals of the sensing transistor) are equal or approximately equal to the voltage drop between the drain and source terminals of the main transistor. Since, during the normal on-state operation, the voltage drop across source-drain terminals of the main transistor is often less than 2V, and it is advantageous for the voltage drop across the sensing load to be on the order of 0.2V or less, it follows that the sensing load resistance may be selected to be less than $\frac{1}{10}$ of that of the on-state resistance of the sensing load transistor. Typical values of these resistances could be in the ohm range (e.g. 1-5 ohm), however it will be understood that all of the values given above may vary significantly depending on the specific ratings and applications where the device is used.

As a result, and broadly speaking, in the current sensing devices described in this disclosure, it is advantageous, but not required, for the voltage signal across the sensing load to be small when compared to voltage drop between the source and drain terminals of the sensing transistor (and/or the sensing load resistance should otherwise be small when compared to the resistance of the sensing transistor) to improve the accuracy of the current sensing solution. This similarly applies when the sensing load is placed between the drain terminals of the main power transistor and sensing transistor as illustrated in FIG. 3.

Figure 3:
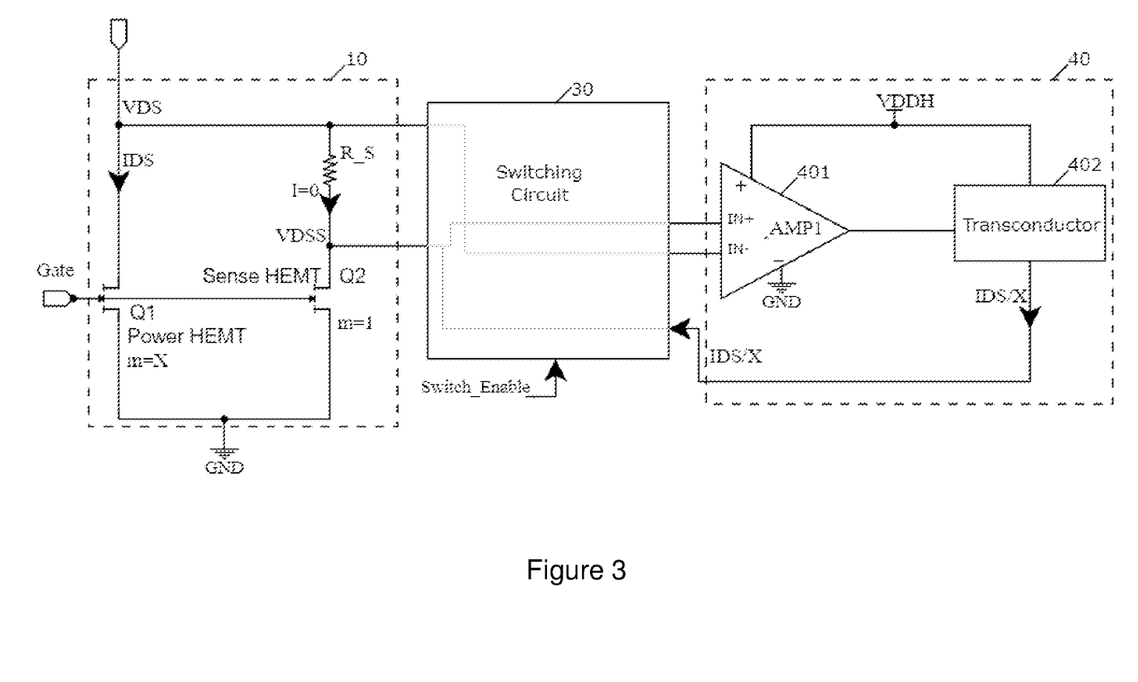
FIG. 3 depicts schematically an example block diagram of a current sensing circuit according to an aspect of the present disclosure.

FIG. 3 illustrates a schematic diagram of a current sense architecture according to the present disclosure which illustrates, at a high level, the advantages provided by a feedback circuit. The architecture comprises a power device circuit 10, a switching circuit 30 and a feedback circuit 40. The power device circuit 10 comprises a power transistor Q1, a sensing transistor Q2 and a resistive sensing load R_S. The switching circuit 30 connects and disconnects the power device circuit 10 to the feedback circuit 40 based on a Switch_Enable signal. The feedback circuit 40 comprises an operational amplifier AMP1 (401) and a transconductor 402.

Figure 4:
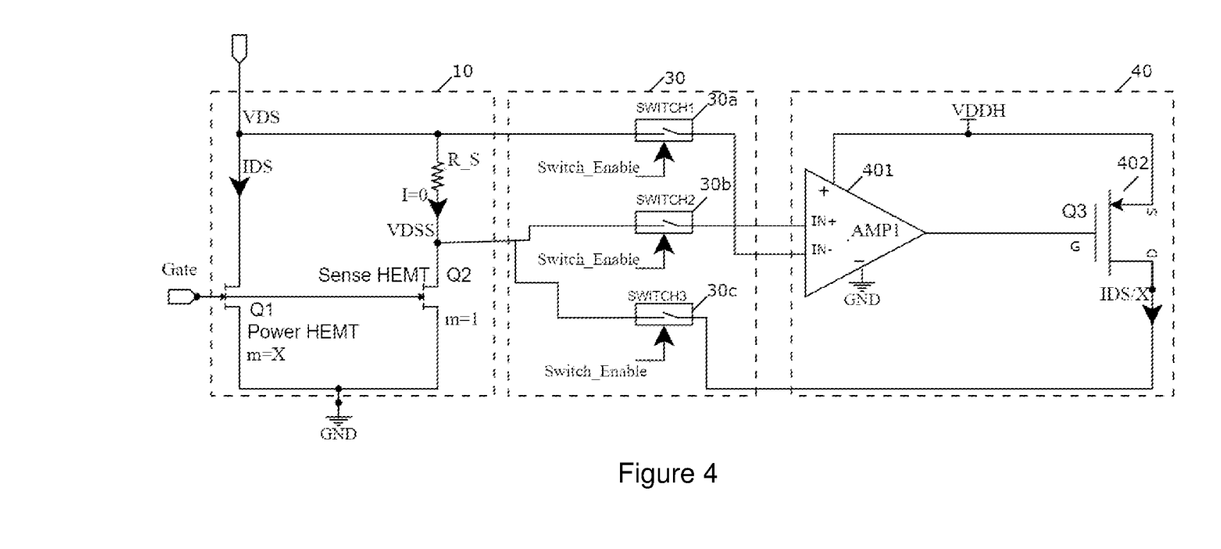
FIG. 4 depicts schematically an example current sensing circuit according to an aspect of the present disclosure.

In the example illustrated in FIG. 4, the feedback circuit 40 comprises an operational amplifier AMP1 and an additional p-channel transistor Q3 as a transconductor. The switching circuit 30 comprises three switches 1, 2, 3. During steady state operation of the power transistor, it is ensured that the sensing transistor always "follows" the power transistor in terms of terminal-to-terminal voltages and the voltage drop across the resistive sensing load is largely zero.

Figure 5:
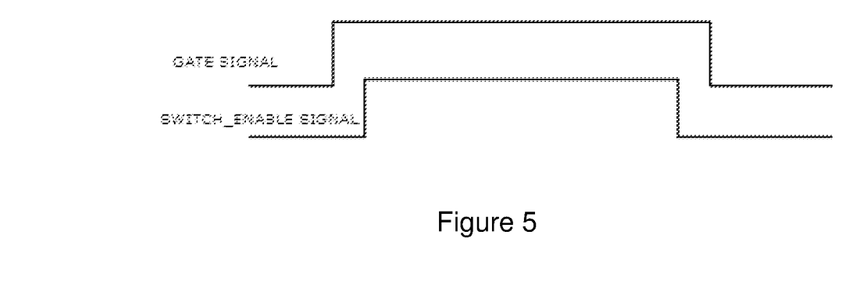
FIG. 5 depicts an example of the pulse sequences according to an aspect of the present disclosure.

During active current sensing mode, when the gate signal is HIGH, switches 1, 2 and 3 are closed and the feedback circuit 40 is connected. To ensure the feedback circuit 40 is protected the signal to close switches 1, 2, 3 may be delayed compared to the gate signal going HIGH. This is to ensure there is sufficient time for the drain-to-source potential across the main power transistor to drop during turn-on before the feedback circuit 40 is connected. An exemplar pulse sequence is illustrated in FIG. 5.

In on-state operation, the VDS of the power transistor is also established across the sensing transistor due to the operation of the feedback circuit. The current through resistor (R_S) is ideally zero since VDS is ideally equal to VDSS.

In this manner, a current signal which is a known ratio of the current through the main power transistor is present in the circuit at the output of the feedback circuit. The sensing transistor has a similar architecture to the main power transistor but has a significantly lower area, or gate perimeter, by a designed ratio m=X which determines the ratio between measured current in the sensing transistor and actual current in the power transistor.

When the gate signal is LOW and the main power transistor operates in the off-state mode of operation, switches 1, 2 and 3 are opened and the feedback circuit is disconnected. This prevents the occurrence of high voltage at the input of the feedback circuit during turn-on and off-state. To ensure the feedback circuit is disconnected before the drain terminal potential of the main power transistor rises, the signal switching switches 1, 2, 3 may precede the gate signal by a short time period as illustrated in FIG. 5.

The VDS of the power transistor is established across the sensing transistor due to resistor R_S. The voltage drop across R_S is negligible as the leakage current through the sensing transistor in the off-state is very small (e.g. <1 uA). Therefore, Dynamic $R_{on}$ changes are replicated in both sense and power HEMT.

Figure 6:
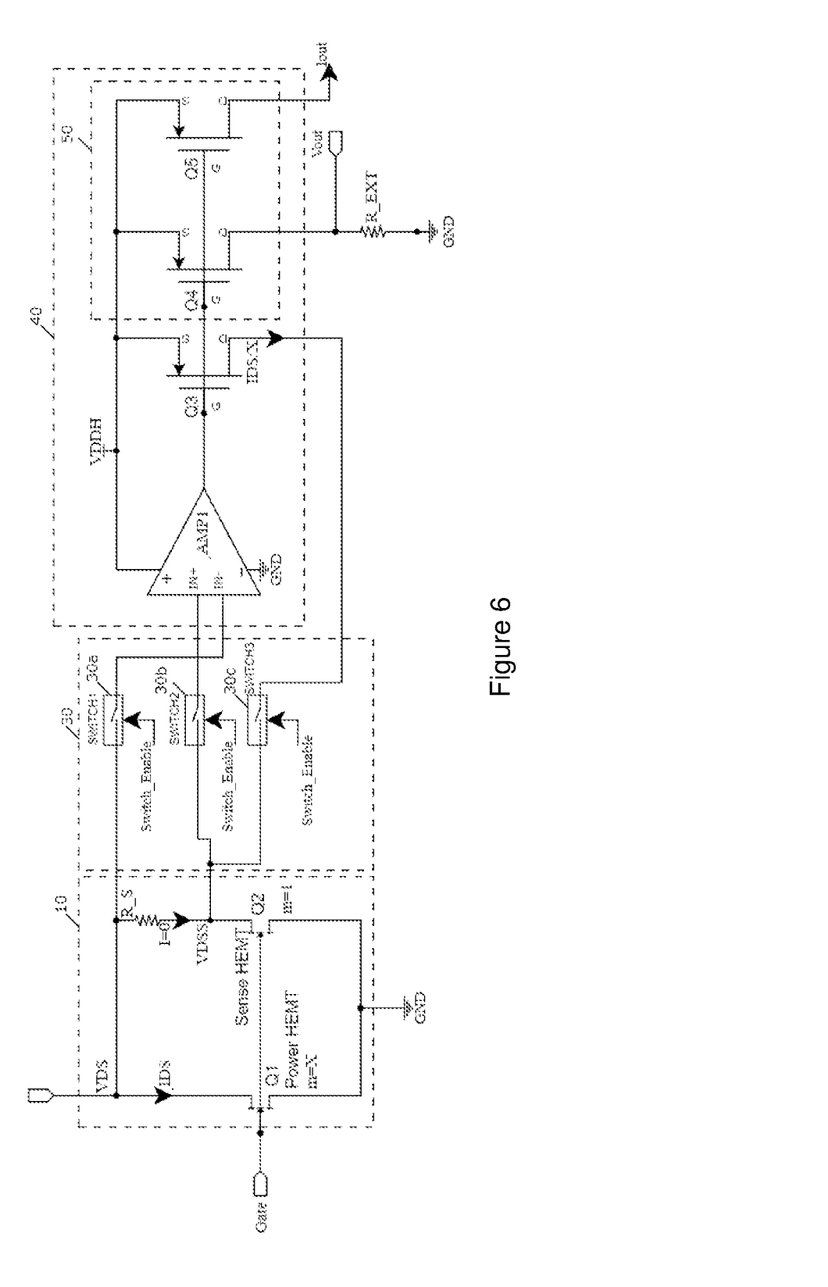
FIG. 6 depicts schematically a second example current sensing circuit with external current output according to an aspect of the present disclosure.

The example in FIG. 3 illustrates how a current IDS/X can be obtained in the circuit. In an additional example, illustrated in FIG. 6, the sense current IDS/X may be mirrored using transistor Q4 and/or Q5. In the case of current mirror using transistor Q5, the sense current can be provided as an external current output. In the case of current mirror using transistor Q4, the output current may be converted to a current sense voltage signal through the use of an external resistor. The external resistor can be chosen to meet the specifications of the controller used in application with the electronic device.

Figure 7:
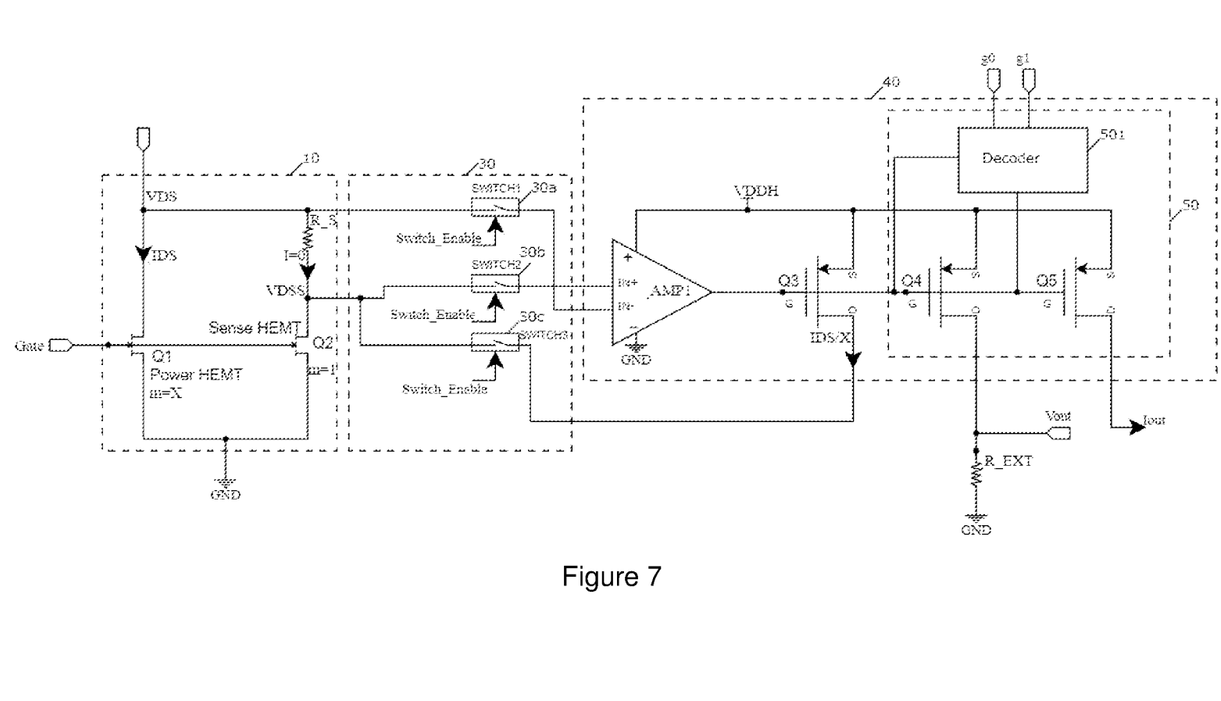
FIG. 7 depicts schematically a third example current sensing circuit with external current output according to an aspect of the present disclosure.

In another example, additional flexibility can be provided through the use of a digital decoder 501 which can adjust the gain of the current mirror by adjusting the size of transistors Q4 and/or Q5. This is illustrated in FIG. 7. The digital decoder input may be provided as external terminals g0, g1 such that the current mirror gain can be adjusted by signals off-chip.

Figure 8:
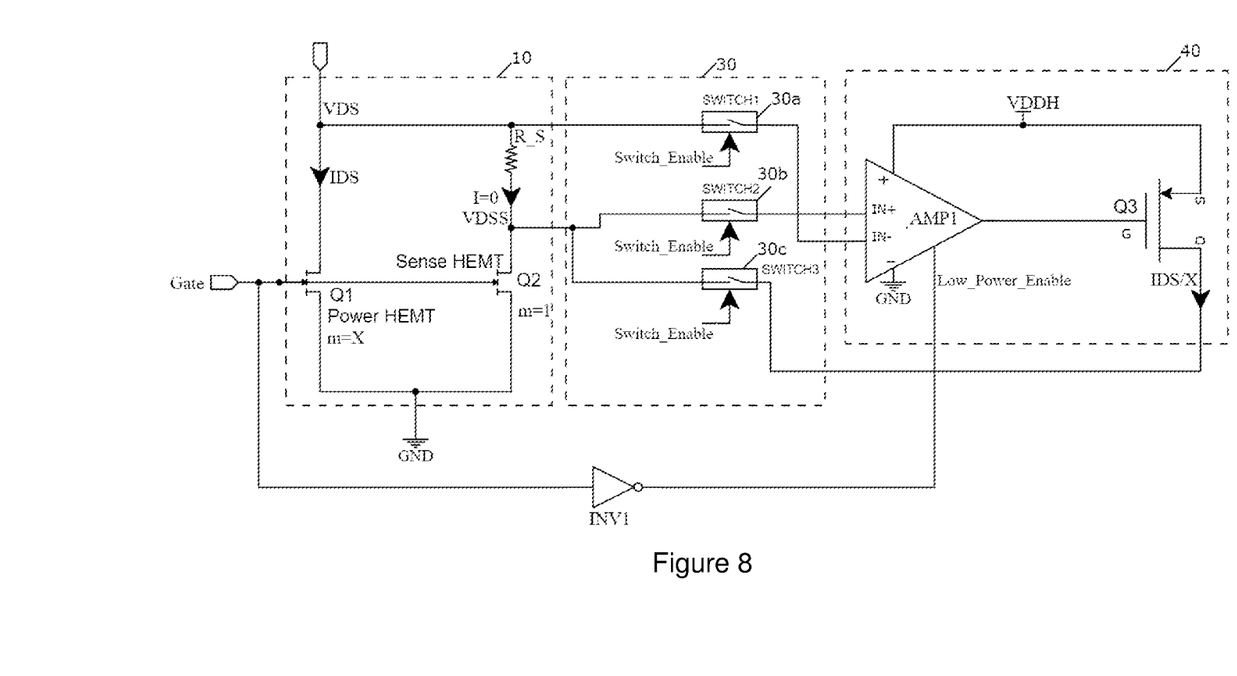
FIG. 8 depicts schematically a fourth example current sensing circuit according to an aspect of the present disclosure.

As outlined herein, the feedback circuit 40, and as a consequence the operational amplifier AMP1, is disconnected when the gate signal is low. Since the operational amplifier is not functional during this period it would be beneficial to limit its power dissipation. This may be achieved by providing a Low_Power_Enable signal to the operational amplifier during the period when the gate signal is LOW. The Low_Power_Enable signal may therefore be an inverted gate drive signal as illustrated in FIG. 8.

Figure 9:
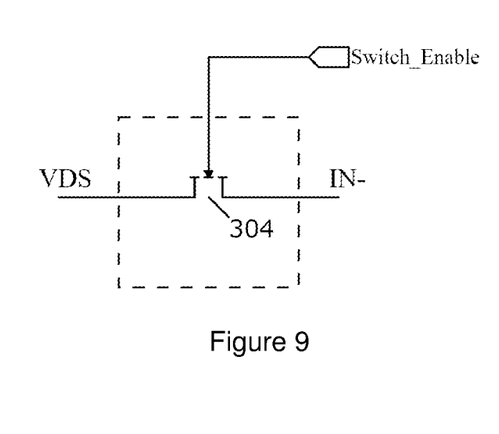
FIG. 9 depicts schematically an example switch according to an aspect of the present disclosure.

FIG. 9 illustrates an example of switches 30*a*, 30*b*, 30*c*. The switch may be a simple enhancement mode transistor similar to the main power transistor (in design but not size). In the case of switch 30*a*, for example, the drain terminal of the switch is connected to the drain terminal of the main power transistor.

Figure 10:
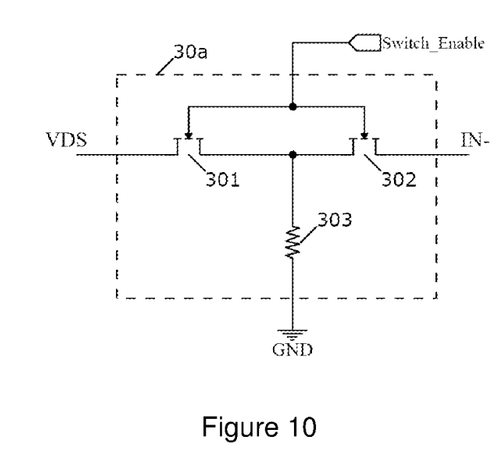
FIG. 10 depicts schematically a second example switch according to an aspect of the present disclosure.

FIG. 10 illustrates a schematic diagram of SWITCH1 that connects the $V_{GS}$ to the IN-input of the operational amplifier AMP1 according to the present disclosure. The other switches SWITCH2 and SWITCH3 also have the same structure. These switches avoid the application of high voltage to the operational amplifier during turn-off of the power device circuit and also enable the feedback from the transconductor to be provided to the drain terminal of the sensing transistor.

Figure 11:
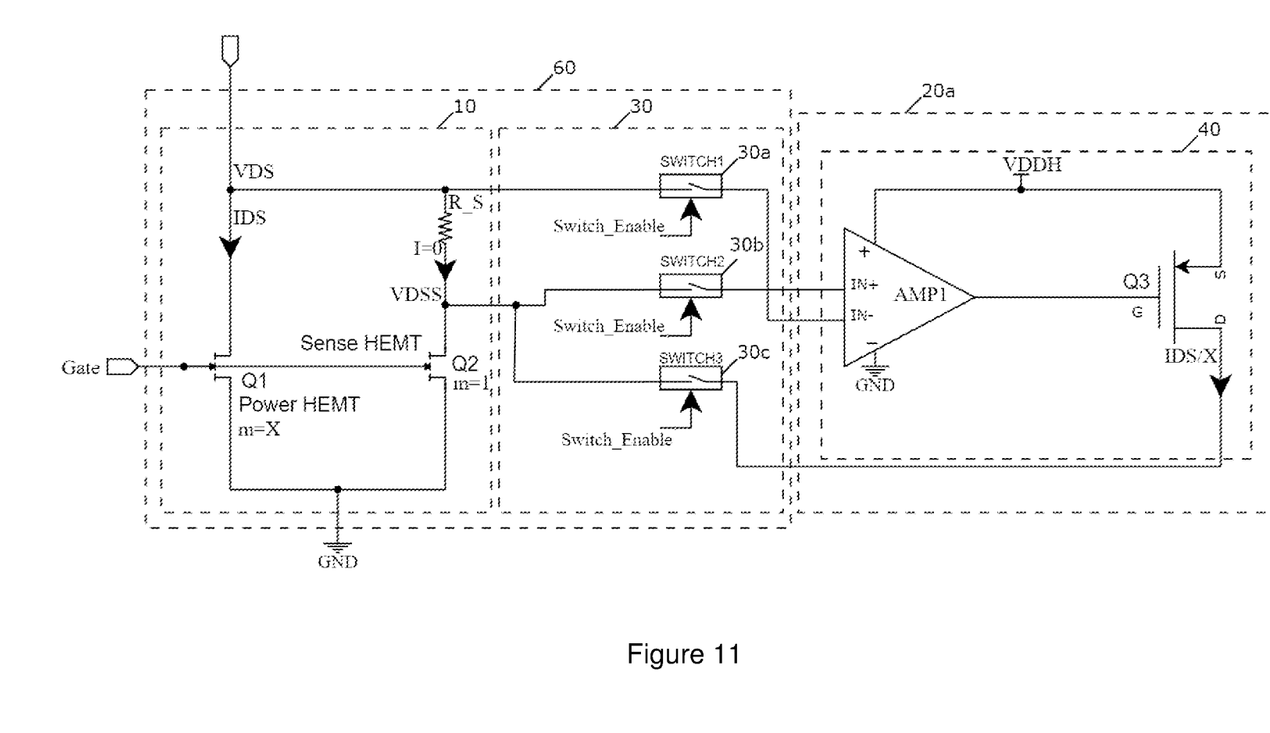
FIG. 11 depicts schematically a fifth example current sensing circuit according to an aspect of the present disclosure.

FIG. 11 illustrates another example of the present disclosure where the current sense architecture comprises a power device circuit 10 comprising a power transistor Q1 and a sensing transistor Q2 implemented on a wide-bandgap semiconductor chip 60, and a feedback circuit 40 implemented on a silicon chip 20*a*. Implementation of power device circuit on wide-bandgap semiconductor chip can enable effective high voltage operation. The switching circuit 30 may also be preferably implemented on wide-bandgap semiconductor chip 60 as the switches are required to block high voltage and can therefore be of a similar technology to the power transistor. As the switches enable selective application of signals to the input of operational amplifier and it can be protected from high voltage, it can be beneficial to implement the operational amplifier on a silicon chip.

In an implementation of this example, the wide-bandgap semiconductor chip 60 may be made up of Gallium Nitride (GaN). Other examples of wide-bandgap semiconductor chip include but not limited to silicon carbide, gallium arsenide, indium phosphide or diamond. Implementing the feedback circuit 40 on a Silicon chip rather than monolithically integrating the feedback circuit on the GaN chip, can offer advantages in terms of speed, power dissipation, design flexibility, yield etc. due to the maturity of Silicon technology compared to GaN technology in particular in regard to the availability of p-channel devices.

Figure 12:
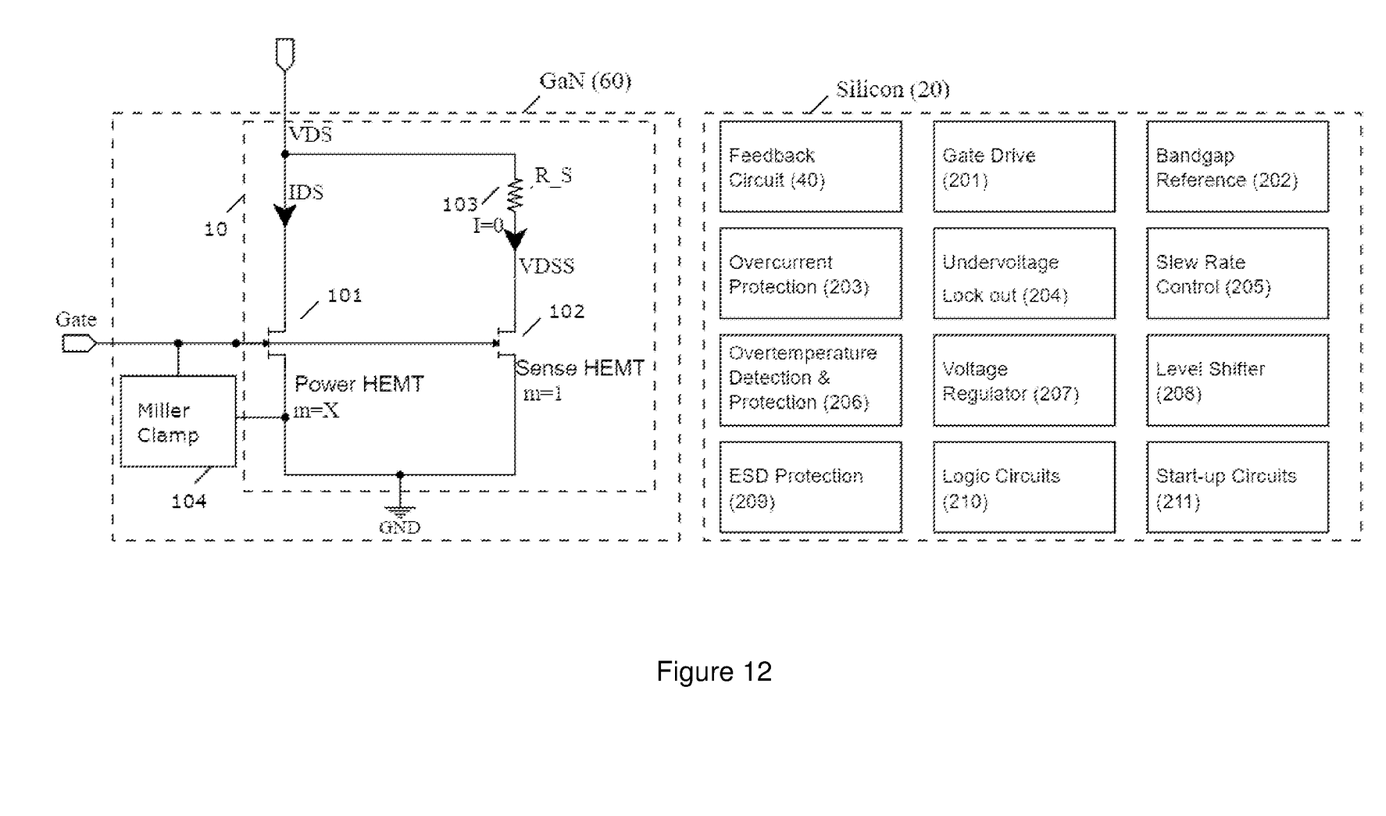
FIG. 12 depicts a block diagram of an electronic device according to an aspect of the present disclosure.

In another example, the electronic device comprises a system in package comprising a GaN semiconductor die 60, and a silicon semiconductor die 20 as illustrated in FIG. 12. The GaN semiconductor die 60 includes the power transistor and the sense transistor while a selection of control and protection circuits are provided on the Silicon semiconductor die. The control and protection circuits include, but are not limited to gate drive, overcurrent protection, overtemperature detection and protection, operational amplifier, voltage regulator, bandgap reference, slew rate control, UVLO, level shifter, ESD protection, logic circuits, start-up circuits and/or any other control and protection circuits. A miller clamp 104 may also be included on the GaN semiconductor die 60.

Figure 13:
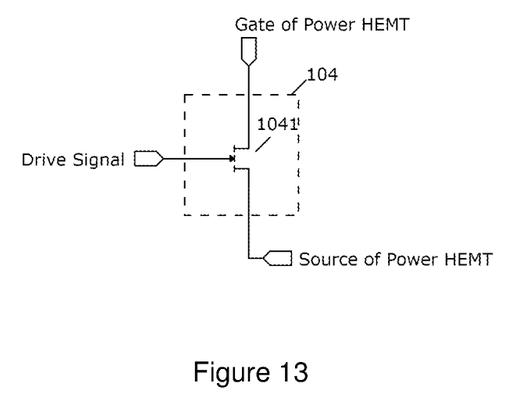
FIG. 13 depicts an example Miller clamp circuit according to an aspect of the present disclosure.

FIG. 13 illustrates one example of Miller clamp 104 shown in FIG. 12. The Miller clamp may be driven by a driving circuit (e.g. inverter) provided in the same GaN die or alternatively provided in the silicon die. In other examples, the Miller clamp may be a distributed Miller clamp i.e. it comprises of a network of sub-transistors which are connected to a distributed network of main power sub-transistors. This may enable a Miller clamp sub-transistor and its associated main power sub-transistor to be in closer proximity such that the connections between them have smaller parasitic components. This may suppress oscillations and/or capacitive coupling effects in the device in operation.

It may be noted that the embodiments illustrated above are only some examples and the present disclosure may be implemented in other embodiments such as all the circuits monolithically integrated in a GaN semiconductor package, a combination of GaN and silicon semiconductor devices in a single package or one or more other types of semiconductor devices such as, but not limited to silicon carbide, gallium arsenide, indium phosphide or diamond in a single package.

The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the scope of the disclosure and appended claims.

The invention claimed is:

1. An electronic device comprising:
a power device circuit comprising:
  a main power transistor, comprising a main drain terminal, a main source terminal and a main gate terminal,
  a resistive sensing load, and
  a sensing transistor comprising a source connected to the main source terminal, a gate connected to the main gate terminal and a drain connected to a first terminal of the resistive sensing load,
a feedback circuit comprising at least one operational amplifier and at least one transconductor, and
a switching circuit comprising at least one switch for connecting and disconnecting the power device circuit to the feedback circuit,
wherein a first input of the at least one operational amplifier and a second terminal of the resistive sensing load are selectively connected to the main drain terminal through the switching circuit,
wherein a second input of the at least one operational amplifier and at least one output of the at least one transconductor are selectively connected to the drain of the sensing transistor through the switching circuit, and
wherein the main power transistor has a first area or gate perimeter, and
wherein the sensing transistor has a second area or gate perimeter smaller than the first area or gate perimeter, and
whereby, during an ON state of the main power transistor, an output current of the at least one transconductor of the feedback circuit is proportional to a potential difference between the main drain terminal and the drain of the sensing transistor, resulting in a voltage across the resistive sensing load of substantially zero.

2. The electronic device of claim 1, wherein during an OFF state of the main power transistor, the switching circuit is configured to disconnect the feedback circuit from the power device circuit, resulting in an increase of a drain to source voltage of the sensing transistor until said voltage is substantially the same as a drain to source voltage of the main power transistor.

3. The electronic device of claim 1, wherein an output current of the feedback circuit is directly proportional to a current flowing through the main power transistor.

4. The electronic device of claim 1, wherein the operational amplifier is configured to amplify a potential difference between the main drain terminal and the drain of the sensing transistor,
wherein an output of the operational amplifier is connected to an input of the transconductor, and
wherein an output current of the transconductor is proportional to the output of the operational amplifier.

5. The electronic device of claim 4, wherein the feedback circuit is configured to provide the output current of the transconductor to the drain terminal of the sensing transistor to create a feedback loop configured to maintain the potential difference between the main drain terminal and the drain of the sensing transistor at a constant value.

6. The electronic device of claim 1, wherein the operational amplifier is configured to be operated in a low power consumption mode by a conditioned gate drive signal wherein the gate drive signal is inverted, time shifted, or level shifted.

7. The electronic device of claim 1, wherein the at least one transconductor is a p-channel transistor.

8. The electronic device of claim 1, wherein the switching circuit is configured to: (i) connect the feedback circuit to the power device circuit a predetermined time after turn-on of the power device circuit and (ii) disconnect the feedback circuit from the power device circuit a predetermined time before turn-off of the power device circuit.

9. The electronic device of claim 1, wherein the switching circuit comprises a first, a second and a third switch configured to connect and disconnect:
the main drain terminal to the first input of the operational amplifier of the feedback circuit,
the drain of the sensing transistor to the second input of the operational amplifier, and
an output of the transconductor to the drain of the sensing transistor, respectively.

10. The electronic device of claim 9, wherein the first, second and third switches comprise enhancement mode HEMTs.

11. The electronic device of claim 9, wherein the first, second and third switches comprise T-type switches with two enhancement mode transistors connected in series, respective gate terminals of the first, second and third switches being connected to a switch enable signal and a high impedance component having a first end connected between the respective two enhancement mode transistors and a second end connected to ground.

12. The electronic device of claim 1, wherein the feedback circuit comprises a current mirror circuit configured to generate an output current identical to the output current of the transductor.

13. The electronic device of claim 12, wherein the electronic device is configured to convert the output current of the current mirror circuit into an output voltage signal using a resistor.

14. The electronic device of claim 12, comprising a digitally programmable decoder configured to adjust a gain of the current mirror circuit responsive to one or more digital inputs to the digitally programmable decoder.

15. The electronic device of claim 1, comprising a wide-bandgap semiconductor die and a silicon semiconductor die, wherein the power device circuit and the switching circuit are provided on the wide-bandgap semiconductor die and the feedback circuit is provided on a silicon semiconductor die.

16. The electronic device of claim 15, wherein the wide-bandgap semiconductor die and the silicon semiconductor die are incorporated in a single system-in-package.

17. The electronic device of claim 15, wherein the silicon semiconductor die comprises at least one of:
a gate driving circuit;
an over-current protection circuit;
an over-temperature detection and protection circuit;
an under-voltage detection or lock out circuit;
a voltage regulator;
a bandgap reference circuit;
a level shifter; an ESD protection circuit; a start-up circuit; a logic circuit; memory storage; and/or
a slew rate control circuit.

18. The electronic device of claim 15, wherein the wide-bandgap semiconductor die is a gallium nitride (GaN) die.

19. The electronic device of claim 1, comprising a wide-bandgap semiconductor die and a silicon semiconductor die, wherein the power device circuit is provided on the wide-bandgap semiconductor die, and the switching circuit and the feedback circuit are provided on a silicon semiconductor die.

20. The electronic device of claim 1, wherein the main power transistor comprises an active heterojunction transistor comprising a, Miller clamp transistor, and wherein the Miller clamp transistor is monolithically integrated with driving circuitry of the active heterojunction transistor.

* * * * *